(12) United States Patent
Bartley et al.

(10) Patent No.: US 6,757,175 B1
(45) Date of Patent: Jun. 29, 2004

(54) METHOD AND EMBEDDED BUS BAR STRUCTURE FOR IMPLEMENTING POWER DISTRIBUTION

(75) Inventors: Gerald Keith Bartley, Rochester, MN (US); Paul Eric Dahlen, Rochester, MN (US); Philip Raymond Germann, Rochester, MN (US); Andrew B. Maki, Rochester, MN (US); Mark Owen Maxson, Mantorville, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/401,250

(22) Filed: Mar. 27, 2003

(51) Int. Cl.$^7$ .................................................. H05K 7/02
(52) U.S. Cl. ........................ 361/775; 361/753; 257/691; 29/831
(58) Field of Search ............................... 361/775, 753, 361/813; 257/691, 699; 29/830, 831; 438/121, 125

(56) References Cited

U.S. PATENT DOCUMENTS

| | | | |
|---|---|---|---|
| 3,761,770 A | * | 9/1973 | Alessio et al. ............. 361/729 |
| 4,589,057 A | * | 5/1986 | Short ......................... 361/718 |
| 4,905,123 A | * | 2/1990 | Windle et al. .............. 361/710 |
| 5,748,451 A | | 5/1998 | Thompson et al. ......... 361/788 |
| 6,088,227 A | * | 7/2000 | Bujtas et al. ............... 361/719 |
| 6,127,726 A | * | 10/2000 | Bright et al. ............... 257/691 |

* cited by examiner

*Primary Examiner*—John B. Vigushin
(74) *Attorney, Agent, or Firm*—John Pennington (57) ABSTRACT

A method and embedded bus bar structure are provided for implementing power distribution in an electronic system. A stiffener includes an embedded power bus bar structure for distributing power. The embedded power bus bar structure has a predefined pattern within a selected area of the stiffener. The selected area is separated from at least one predefined area. A printed circuit board is mounted to the stiffener and electrically connected to the embedded power bus bar structure. The embedded power bus bar structure can include multiple spaced apart power bus bars, enabling the power distribution of multiple voltage levels. The predefined pattern of the embedded power bus bar structure within the selected area of the stiffener is separated from each predefined site for a Land Grid Array (LGA).

12 Claims, 7 Drawing Sheets

METHOD AND EMBEDDED BUS BAR STRUCTURE FOR IMPLEMENTING POWER DISTRIBUTION

FIELD OF THE INVENTION

The present invention relates to a method and embedded bus bar structure for implementing power distribution in an electronic system.

DESCRIPTION OF THE RELATED ART

Current and future high performance computer systems and server systems rely on both large-scale packaging of multiple high density interconnect modules and printed circuit boards. High signal speed integrated circuit devices are being fabricated in increasingly smaller sizes and requiring increasing numbers of connector pins or other connection interface structures within a spatial footprint.

LGA (Land Grid Array) module attach technologies have been used for the attachment of large ceramic modules to the backplane within computer systems for the last several years. LGA connection systems essentially clamp a formable connector pad between a substrate and the board by applying pressure from a backing plate, typically using a planar stiffener, and the module lid, cap, or heatsink. Bussing power on the topside of the card or board can force changes in the area of the LGA module which would cause significant requalification testing for the module connection technology. These types of connection technologies rely on flatness, stiffness, and generally a uniform structure underneath the LGA connection system to perform consistently.

Traditional planar stiffeners are needed to contact the printed circuit board or backplane and provide support for connectors and other large components such as heatsinks and land grid array (LGA) modules. These contact areas restrict where logic components can be placed. Often one whole side of the printed circuit board is consumed by stiffeners which restricts major components to a single side of the card or board. With all of the major and normally largest power consuming components on one side of the card, the use of traditional bus bars adds more competition for space and airflow.

U.S. Pat. No. 5,748,451, issued May 5, 1998 to Thompson et al. and assigned to the present assignee, discloses a backplane assembly that includes stiffeners to provide both mechanical stiffening and electrical power distribution. A power distribution system comprises a backplane, a power stiffener having alternate layers of dielectrics and conductors proximately located to the backplane, and removable connection to electrically connect the conductors in the stiffener to the backplane. Because power can be transferred directly to the backplane from the stiffener via the connection, the need for power cables and bus bars on the backplane is eliminated. In addition, noise suppressing capacitors may be located on the power stiffener, close to the load source.

Around Ground Design is a design approach currently being increasingly utilized in the layout of a printed circuit board (PCB). The approach essentially references signals to only ground as they are routed around the system. This is done to simplify return-current or image currents issues. By employing this approach, there is often an unbalanced amount of ground plane requirements (for routing of signals) than would otherwise be used in traditional ground-signal-voltage-signal-ground stackup methodologies. This unbalanced approach can make it impossible to get enough power plane copper within the card or board stackup to support the voltage distribution requirements while providing sufficient ground plane surfaces to reference the signals. This leads to the need for additional power distribution elements such as bus bars. Those additional elements compete for volume, block airflow, and generally complicate the layout of the logic board if allowed to be on the component side of the card or board.

As system design gets more complex, the number of required core and input/output (I/O) voltage domains as well as legacy voltage levels continues to increase, causing multiple voltage domains to be contained on a single layer in the board design. As a result, significant routing issues arise as well as degradation of signal quality. Reducing the number of voltage domains will reduce the number of voltage domains splits, which is a gap between two voltage domains on a card. If critical signal wiring is routed over one of these splits, the signal is degraded due to multiple effects i.e. increased inductance in the return-current path, large potential buildups at boundary between domains. A common practice is to not allow any critical wiring to cross these power planes splits which decreases board routability; however, tradeoffs also are made to allow signals to cross these voltage domains splits.

A need exists for an improved mechanism for implementing power distribution in an electronic system.

As used in the present specification and claims, the term printed circuit board or PCB means a substrate or multiple layers (multi-layer) of substrates used to electrically attach electrical components and should be understood to generally include circuit cards, printed circuit cards, backplanes, printed wiring cards, and printed wiring boards.

SUMMARY OF THE INVENTION

A principal object of the present invention is to provide a method and embedded bus bar structure for implementing power distribution in an electronic system. Other important objects of the present invention are to provide such method and embedded bus bar structure for implementing power distribution substantially without negative effect and that overcome some of the disadvantages of prior art arrangements.

In brief, a method and embedded bus bar structure are provided for implementing power distribution in an electronic system. A stiffener includes an embedded power bus bar structure for distributing power. The embedded power bus bar structure has a predefined pattern within a selected area of the stiffener. The selected area is separated from at least one predefined area. A printed circuit board is mounted to the stiffener and electrically connected to the embedded power bus bar structure.

In accordance with features of the invention, the embedded power bus bar structure can include multiple spaced apart power bus bars, enabling the power distribution of multiple voltage levels. The predefined pattern of the embedded power bus bar structure within the selected area of the stiffener is separated from each predefined site for a Land Grid Array (LGA). The embedded power bus bar structure in the stiffener does not affect the stiffener area under each LGA module connected to the printed circuit board.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the preferred embodiments, an embedded power bus bar structure is provided for implementing power distribution in an electronic system. The power bus bar structure is embedded within a typically required mechanical support structure or stiffener of planar and card-on-board computer systems. The embedded bus bar technique of the preferred embodiments avoids some disadvantages of conventional bus bar technology that is typically employed on the opposite side of a backplane from any mechanical supports and stiffeners.

Figure 1:
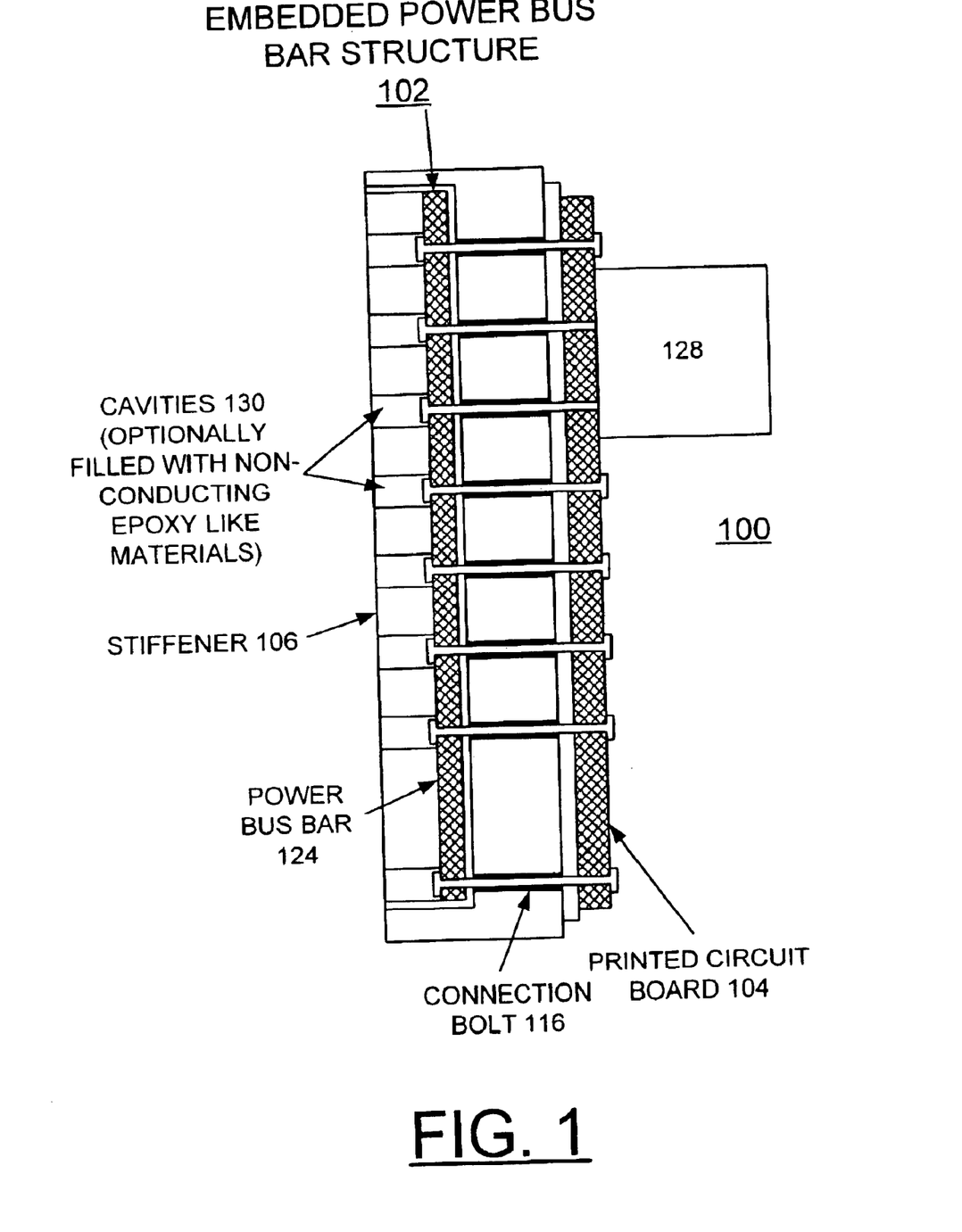
FIG. 1 is a cross-sectional side view of an electronic system in accordance with the preferred embodiment.
Figure 2:
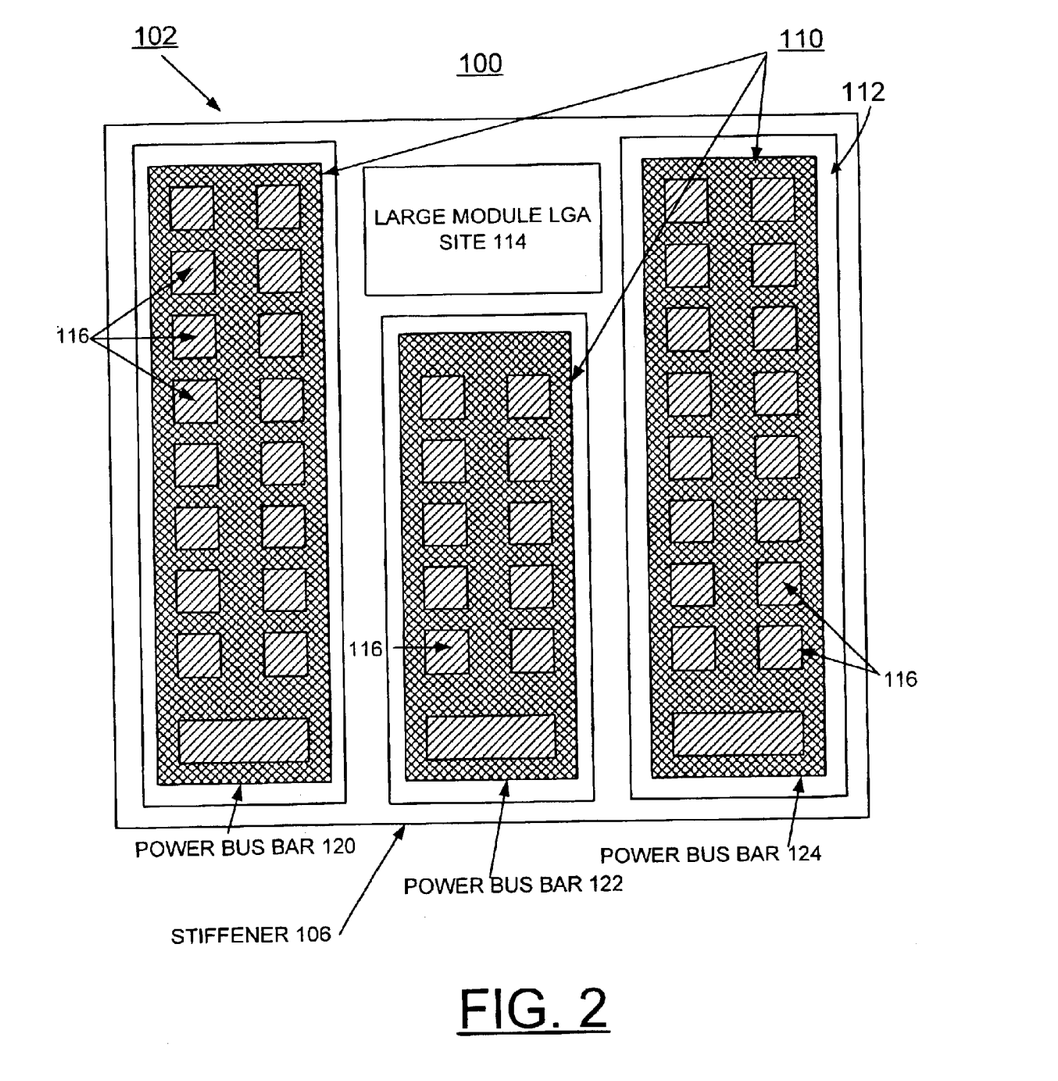
FIG. 2 is a cross-sectional front view illustrating a power bus bar structure embedded in a stiffener of the electronic system of FIG. 1 in accordance with the preferred embodiment.
Figure 3:
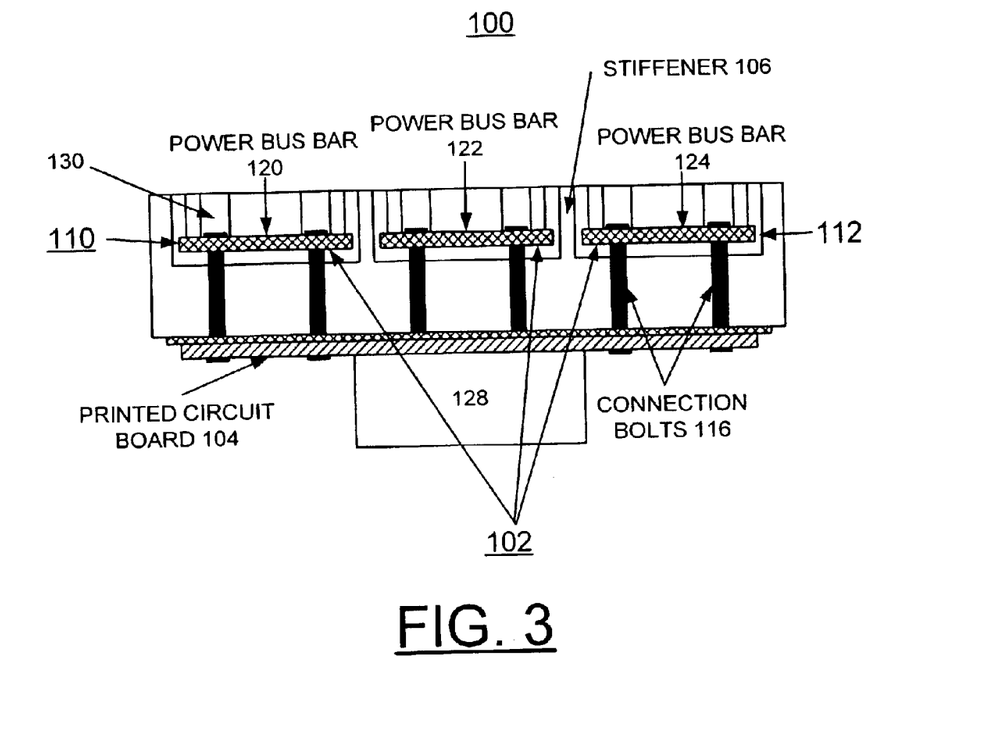
FIG. 3 is a cross-sectional top view of the electronic system of FIG. 1 in accordance with the preferred embodiment.

Having reference now to the drawings, in FIGS. 1–3, there is shown an electronic system generally designated by the reference character 100 including a power bus bar structure generally designated by the reference character 102 for implementing power distribution in accordance with the preferred embodiment. System 100 includes a printed circuit board (PCB) 104 mounted to a stiffener 106. Stiffener 106 includes the embedded power bus bar structure 102 for distributing power. The bus bar structure 102 of the preferred embodiment functions to free an outside volume of PCB 104 for airflow, and other components.

Referring now to FIG. 2, the embedded power bus bar structure 102 has a predefined pattern generally designated by the reference character 110 within a selected area generally designated by the reference character 112 of the stiffener 106. The selected area 112 is separated from at least one predefined area 114. The printed circuit board 104 is supported by the stiffener 106 and electrically connected to the embedded power bus bar structure 102 by a plurality of connection bolts 116.

As shown in FIG. 2, the embedded power bus bar structure 102 includes a plurality of spaced apart power bus bars 120, 122, 124, enabling the respective power distribution of multiple voltage levels, such as, 3.3 volts, 2 volts, and 1.2 volts. The predefined pattern 110 of the embedded power bus bar structure 102 is separated from each predefined site 114 for a Land Grid Array (LGA) module 128. The embedded power bus bar structure 102 does not affect the function of the stiffener 106 in the stiffener area 114 under each LGA module 128 connected to the printed circuit board 104.

Stiffness provided by the embedded bus bar structure 102 contributes to the overall mechanical integrity of the stiffener 106. Standoffs, optional polymer fill, epoxy, and the like could be provided to augment the strength of materials. Cavities 130 within the stiffener 106 in line with the connection bolts 116 optionally are filled with non-conducting epoxy type materials.

Figure 4:
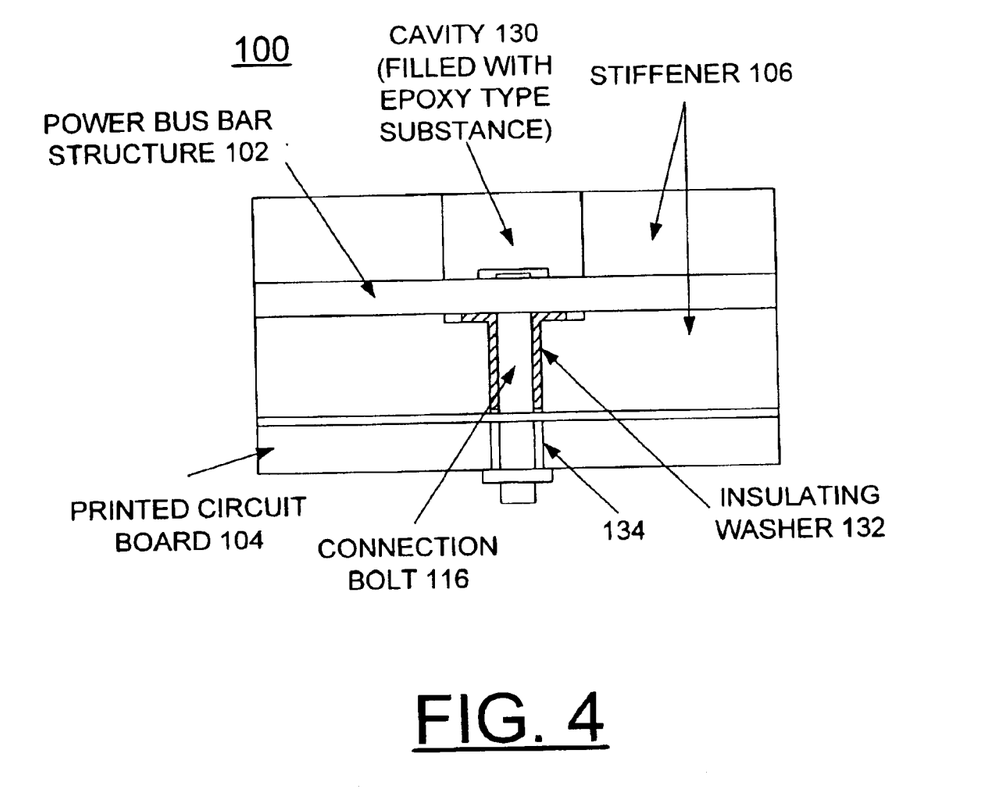
FIG. 4 is an enlarged side fragmentary detailed view of the electronic system of FIG. 1 in accordance with the preferred embodiment.

Referring to FIG. 4, there is shown an enlarged side fragmentary detailed view illustrating the electrical connection of the power bus bar structure 102 to the PCB 104 in accordance with the preferred embodiment. As shown, an insulating washer 132 surrounds the connection bolt 116 within the stiffener 106. The connection bolt 116 is provided in mechanical and electrical contact engagement within a conductive feed through 134 within the PCB 104. The insulating washer 132 is only required when the stiffener 106 is made of electrically conductive material.

In accordance with features of the preferred embodiments, since this invention provides the bus bar structure 102 embedded within the already required stiffener 106, the conflict between components and power distribution on the PCB 104 is significantly reduced. Using the embedded approach for the bus bar structure 102, allows for routing up to, and even around the area 114 of the LGA module 128 without requiring blockage of heatsink area, or different bolt down patterns for the connection bolts 116. The embedded approach for the bus bar structure 102 preserves the conventional design understanding and thus reduces the overall testing requirements and simplifies usage of known LGA connection techniques.

In accordance with features of the preferred embodiments, the multiple embedded power bus bars or elements 120, 122, 124 of structure 102 within the stiffener 106, allows for improved power distribution, while freeing up PCB power plane layers of PCB 104 for signal distribution, particularly useful with the around ground approach. The embedded power bus bar structure 102 has an overall, generally large predefined area for providing a selected current capability. The ability to bus voltage domains with the embedded power bus bar structure 102 in the stiffener 106 allows for a reduction in the number of voltage domains bussed in the PBC 104 thus will open more wiring channels as well as decrease the number of critical signals crossing splits. Routing non-signal reference voltages with embedded bus bars eliminates the complexity of split voltage planes.

Figure 5:
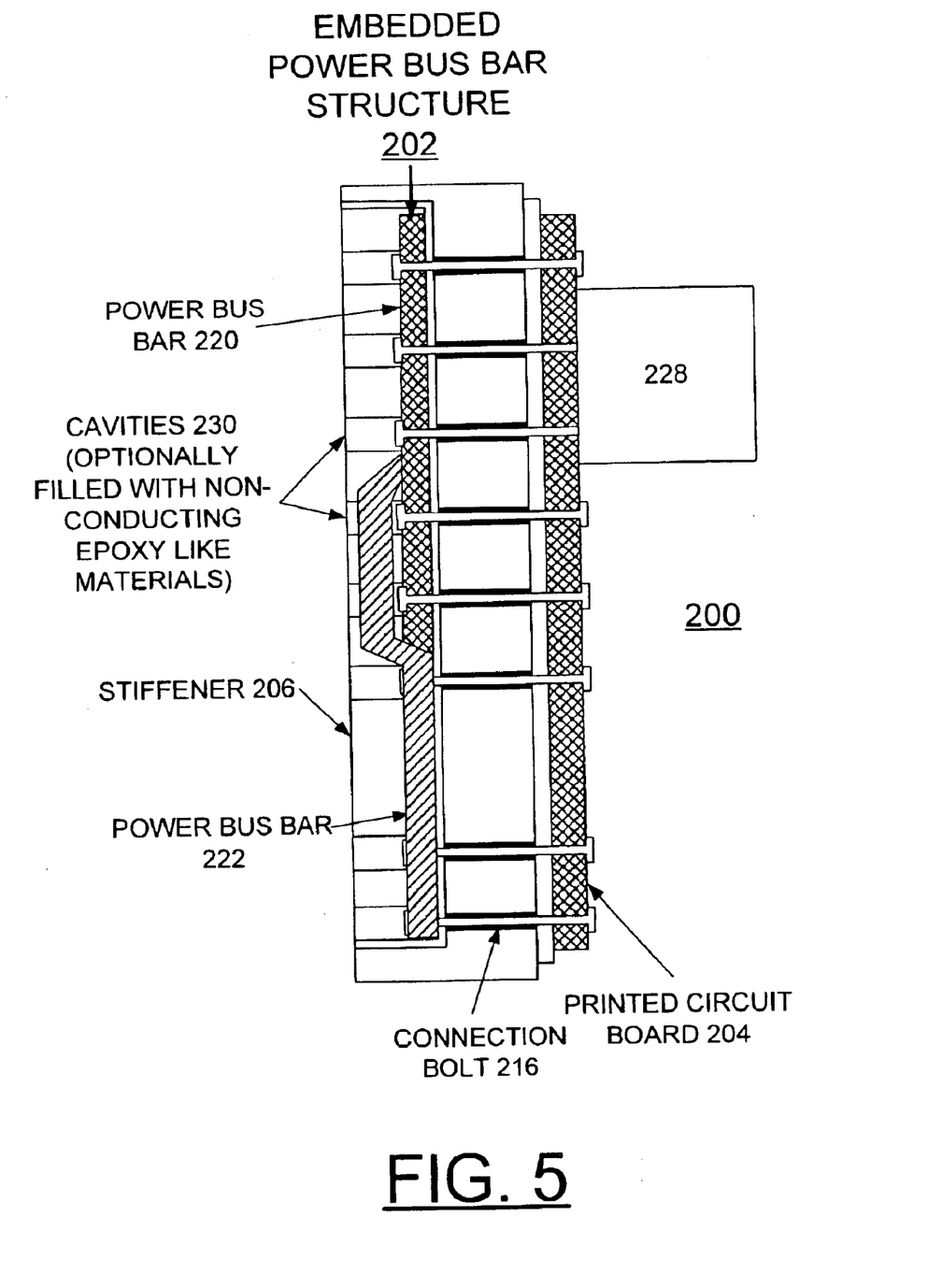
FIG. 5 is a cross-sectional side view of an alternative electronic system in accordance with the preferred embodiment.
Figure 6:
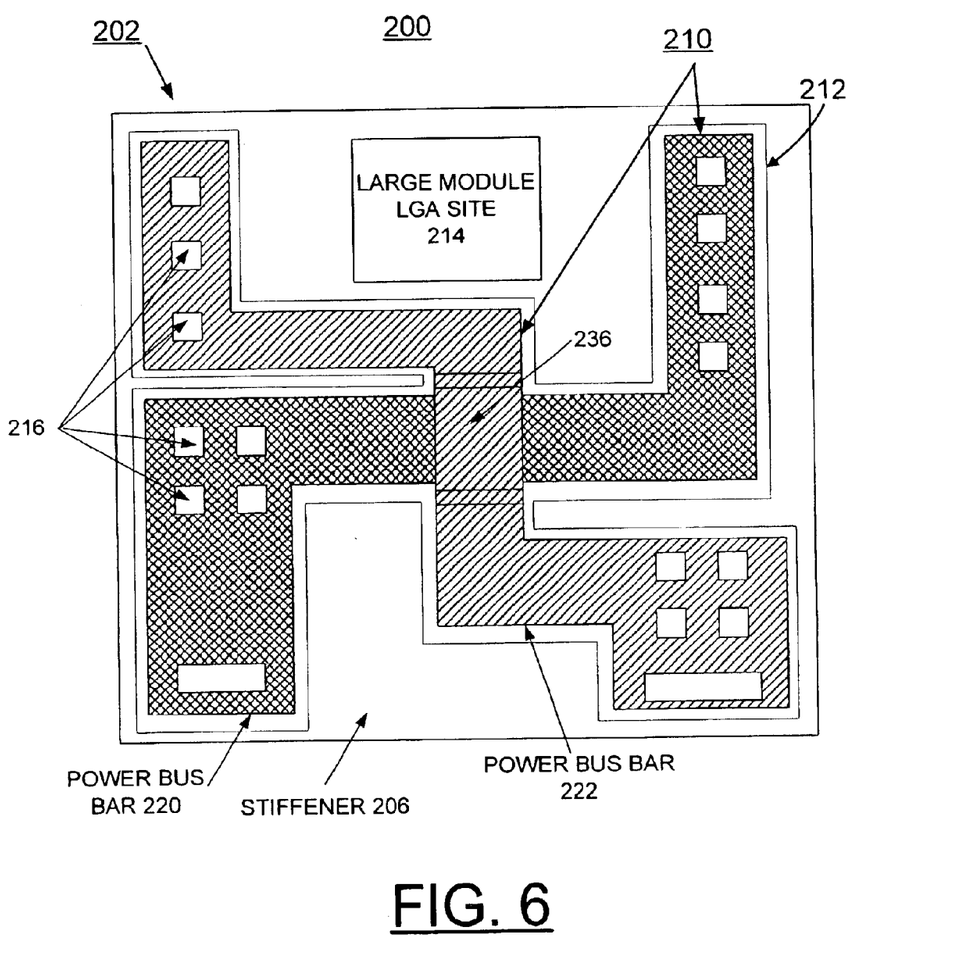
FIG. 6 is a cross-sectional front view illustrating an alternative power bus bar structure embedded in a stiffener of the alternative electronic system of FIG. 5 in accordance with the preferred embodiment.
Figure 7:
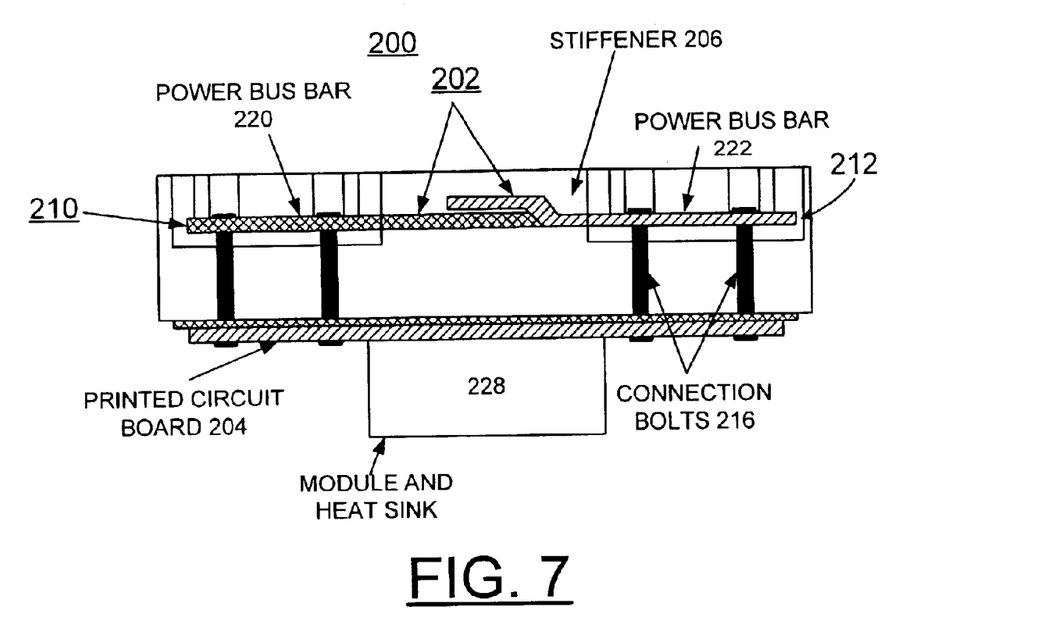
FIG. 7 is a cross-sectional top view of the alternative electronic system of FIG. 5 in accordance with the preferred embodiment.

Referring now to FIGS. 5–7, there is shown an alternative electronic system generally designated by the reference character 200 including a power bus bar structure generally designated by the reference character 202 for implementing power distribution in accordance with the preferred embodiment. System 200 includes a printed circuit board (PCB) 204 mounted to a stiffener 206. Stiffener 206 includes the embedded power bus bar structure 202 for distributing power. The bus bar structure 202 of the preferred embodiment provides similar advantages and features as the power bus bar structure 102 of FIG. 1.

Referring now to FIG. 6, the embedded power bus bar structure 202 has a predefined pattern generally designated by the reference character 210 within a selected area generally designated by the reference character 212 of the stiffener 206. The selected area 212 is separated from at least one predefined area 214, for example, corresponding to a large LGA site. The printed circuit board 204 is supported by the stiffener 206 and electrically connected to the embedded power bus bar structure 202 by a plurality of connection bolts 216.

As shown in FIG. 6, the embedded power bus bar structure 202 includes a pair of spaced apart power bus bars 220, 222, enabling the respective power distribution of multiple voltage levels, such as, 3.3 volts, and 1.2 volts. The predefined pattern 210 of the embedded power bus bar structure 202 is separated from each predefined site 214 for a Land Grid Array (LGA) module 228. The embedded power bus bar structure 202 does not affect the function of the stiffener 206 in the stiffener area 214 under each LGA module 228 connected to the printed circuit board 204.

As shown in FIGS. 5–7, in the embedded power bus bar structure 202, the spaced apart power bus bars 220, 222 are laminated three-dimensional (3-D) structures having a spaced apart cross-over portion 236 separated by an electrically nonconductive material 238.

It should be understood that the present invention is not limited to the illustrated embedded bus bar structures 102 and 202, various other configurations can be provided.

In accordance with features of the preferred embodiments, the embedded bus bar structures 102 and 202 are compatible with and can be implemented with conventional laminated bus bar technologies. The arrangement of the embedded bus bar structures 102 and 202 facilitates servicing the bus bars 120, 122, 124, and 220, 222 and customizing the bus bars for a common stiffener design in accordance with the preferred embodiments that could be used for different system designs. Different system designs traditionally would require a new card or board layout. The embedded bus bar 102 for power distribution allows for change in the voltage or current requirements of a given module system, simply by changing the embedded bus bars 102. By limiting the change to the bus bars, the printed circuit board design can be preserved.

While the present invention has been described with reference to the details of the embodiments of the invention shown in the drawing, these details are not intended to limit the scope of the invention as claimed in the appended claims.

What is claimed is:

1. An electronic system comprising:
    a printed circuit board including a predefined site for a Land Grid Array (LGA);
    a stiffener,
    a power bus bar structure for distributing power embedded in said stiffener; said embedded power bus bar structure having a predefined pattern within a selected area of the stiffener; said selected area being separated from at least one predefined area in said stiffener corresponding to said predefined site for said Land Grid Array (LGA) with said printed circuit board mounted to the stiffener; and
    said printed circuit board being mounted to the stiffener and electrically connected to the embedded power bus bar structure with a plurality of connection bolts; at least one of said plurality of connection bolts Provided in mechanical and electrical contact engagement with said embedded power bus bar structure.

2. An electronic system as recited in claim 1 wherein said embedded power bus bar structure includes multiple spaced apart power bus bars, said multiple spaced apart power bus bars enabling the power distribution of multiple voltage levels.

3. An electronic system as recited in claim 2 wherein said multiple spaced apart power bus bars include laminated three-dimensional power bus bar structures.

4. An electronic system as recited in claim 2 wherein said multiple spaced apart power bus bars include a cross-over portion separated by an electrically nonconductive material; and at least one of said plurality of connection bolts provided in mechanical and electrical contact engagement with each of said multiple spaced apart power bus bars of said embedded power bus bar structure.

5. An electronic system as recited in claim 1 wherein said predefined pattern of said embedded power bus bar structure is separated from each said predefined site for said Land Grid Array (LGA) on said printed circuit board.

6. An electronic system as recited in claim 1 wherein said printed circuit board is mounted to the stiffener and electrically connected to the embedded power bus bar structure by said plurality of connection bolts; a conductive feed through within said printed circuit board provided in mechanical and electrical contact engagement with one of said plurality of connection bolts.

7. An electronic system as recited in claim 1 wherein said embedded power bus bar structure has a large area for a selected current capability.

8. A method for implementing power distribution in an electronic system including a stiffener with a printed circuit board mounted to the stiffener, the printed circuit board including a predefined site for a Land Grid Array (LGA); said method comprising the steps of:
    disposing an embedded bus bar structure within a selected area of the stiffener; providing said embedded power bus bar structure with a predefined pattern; said selected area being separated from at least one predefined area of said stiffener corresponding to said predefined site for said Land Grid Array (LGA) with the printed circuit board mounted to the stiffener; and
    electrically connecting the printed circuit board to the embedded power bus bar structure using a plurality of connection bolts for mounting the stiffener to the printed circuit board with at least one of said plurality of connection bolts provided in mechanical and electrical contact engagement with the embedded power bus bar structure.

9. A method for implementing power distribution in an electronic system as recited in claim 8 wherein the step of providing said embedded power bus bar structure with said predefined pattern includes providing said embedded power bus bar structure with a plurality of spaced apart power bus bars.

10. A method for implementing power distribution in an electronic system as recited in claim 9 further includes the step of distributing multiple voltage levels to the printed circuit board using said plurality of spaced apart power bus bars with at least one of said plurality of connection bolts provided in mechanical and electrical contact engagement with each of said plurality of spaced apart power bus bars of the embedded power bus bar structure.

11. A method for implementing power distribution in an electronic system as recited in claim 9 further includes providing laminated three-dimensional power bus bar structures to form said plurality of spaced apart power bus bars.

12. A method for implementing power distribution in an electronic system as recited in claim 9 further includes providing said plurality of spaced apart power bus bars with a cross-over portion separated by an electrically nonconductive material.

* * * * *

UNITED STATES PATENT AND TRADEMARK OFFICE
CERTIFICATE OF CORRECTION

PATENT NO. : 6,757,175 B1
DATED : June 29, 2004
INVENTOR(S) : Gerald Keith Bartley et al.

It is certified that error appears in the above-identified patent and that said Letters Patent is hereby corrected as shown below:

Title page,
Item [74], *Attorney, Agent, or Firm*, "John Pennington" should be -- Joan Pennington --.

Signed and Sealed this

Twenty-third Day of November, 2004

JON W. DUDAS
*Director of the United States Patent and Trademark Office*